United States Patent
Briend

(10) Patent No.: US 6,346,154 B1
(45) Date of Patent: Feb. 12, 2002

(54) SUCTION PLATE FOR HOLDING AND SUPPORTING ELECTRONIC CIRCUIT BOARDS DURING PRINTING OPERATION

(76) Inventor: Herve Briend, 2126 Wallace Ave., Aptos, CA (US) 95003

(*) Notice: Subject to any disclaimer, the term of this patent is extended or adjusted under 35 U.S.C. 154(b) by 0 days.

(21) Appl. No.: 09/383,136

(22) Filed: Aug. 25, 1999

(51) Int. Cl.⁷ .................................................. B05C 13/02
(52) U.S. Cl. ........................ 118/500; 369/21; 369/903
(58) Field of Search .................. 118/50, 500; 427/294, 427/295, 96; 269/21, 903

(56) References Cited

U.S. PATENT DOCUMENTS

| | | | |
|---|---|---|---|
| 4,292,116 A | * | 9/1981 | Takahashi et al. |
| 4,538,104 A | * | 8/1985 | Douglas et al. |
| 5,779,794 A | * | 7/1998 | Thompson ................... 118/213 |
| 5,932,065 A | * | 8/1999 | Mitchell ...................... 156/556 |

FOREIGN PATENT DOCUMENTS

JP  5-14000  * 1/1993

OTHER PUBLICATIONS

Fuji Machine Mfg. Co., Ltd GSP ScreenPrinter, Technical Manual, pp. 8–1—8–23 Dated on back page Oct. '92.

* cited by examiner

Primary Examiner—Laura Edwards
(74) Attorney, Agent, or Firm—Morrison & Foerster LLP

(57) ABSTRACT

An apparatus for supporting double sided printed circuit boards during printing a solder past pattern or the like on the second side of the printed circuit board after the first side is already loaded. The apparatus includes components for holding the printed circuit boards in position and support posts with different footprints for supporting the printed circuit board at locations on the first side not occupied by components. The apparatus uses a vacuum chamber and/or vacuum cups for holding the printed circuit board in place. It further includes components for proper positioning the printed circuit boards prior to holding the same in position.

11 Claims, 8 Drawing Sheets

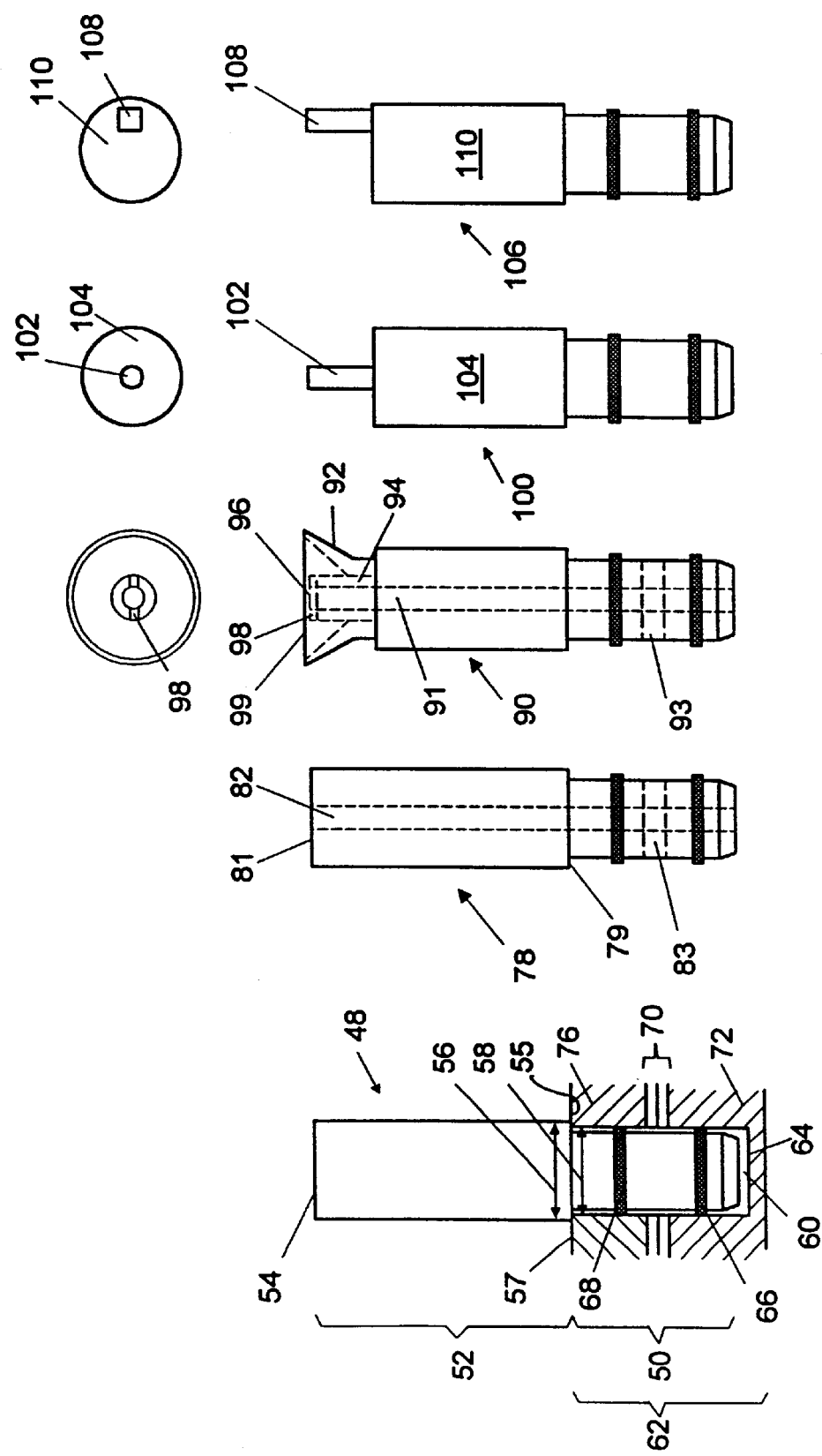

FIG. 3J
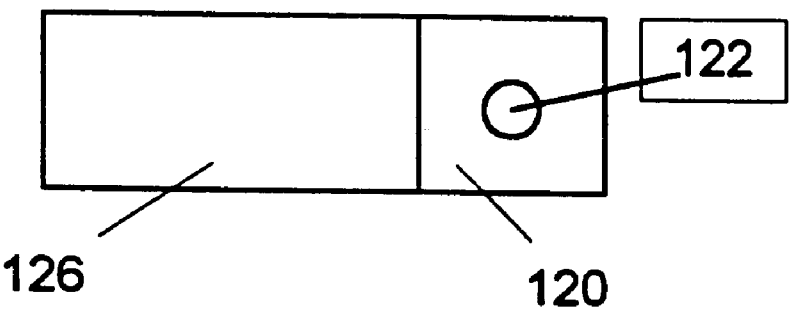
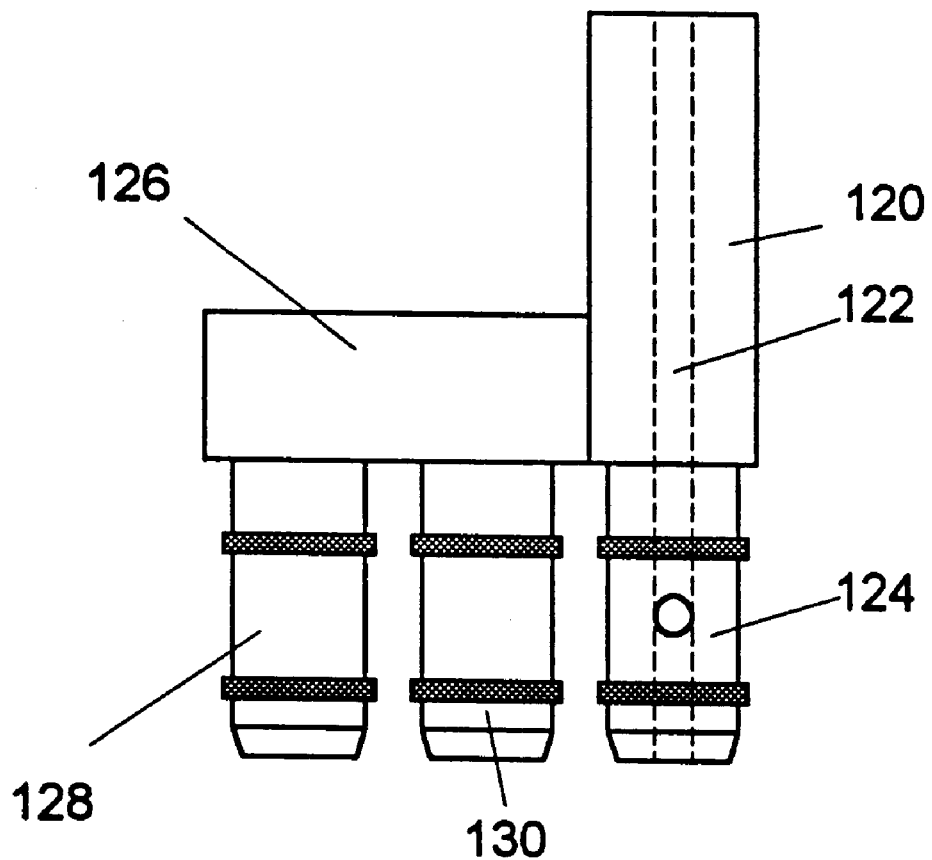
FIG. 3F

SUCTION PLATE FOR HOLDING AND SUPPORTING ELECTRONIC CIRCUIT BOARDS DURING PRINTING OPERATION

BACKGROUND OF THE INVENTION

During production of electronic circuit boards and especially of double sided circuit boards a pattern of solder paste is printed on the circuit board prior to placing and soldering of electronic components to the circuit board using reflow solder methods. For proper application of solder paste the circuit board has to be held in a desired position with high precision, and it has to be supported in various locations to prevent any bending of the circuit board during the printing process.

PRIOR ART

The prior art includes vacuum tables with sidewalls which can be adjusted to the size of the particular printed circuit board to be handled. None of the known vacuum tables includes a plurality of openings, arranged in rows and columns, which can be closed off, inside and outside of the vacuum chamber, and which can be used for positioning support posts for the printed circuit board or left open inside the vacuum chamber to apply a vacuum. None of the prior art systems has a number of different types of support posts, such as support posts with centric or off-center supports, and support posts with suction cups to improve holding power on the printed circuit board during the printing operation.

SHORT DESCRIPTION OF THE INVENTION

The universal suction plate of the present invention prevents damage of electronic components during an application of e.g. a pattern of solder paste, on the second side of a printed circuit board. While printing on the second side of a printed circuit board the first, lower side contains components, such as capacitors, resistors, integrated circuit of different sizes and heights, which can not be used for supporting the printed circuit board. The universal suction plate is used in combination with a printing apparatus, and a conveyor system for supplying printed circuit boards and removing the same after the print operation. The suction plate for holding and supporting electronic circuit boards is placed underneath and aligned with the printing apparatus. The conveyor system supplies the circuit boards to the suction board, which includes sensors to determine the position of a circuit board. A separate apparatus lifts the suction plate to the lower plane of the circuit board. A strong vacuum is generated in the suction chamber or one or more suction cups to hold the circuit board in place. To avoid any buckling or bending of the circuit board by the vacuum and during the print operation, support posts of different forms and shapes are provided at various locations underneath the circuit. After completion of the print operation the vacuum is released, the suction plate is lowered, and the circuit board is forwarded by the conveyor system to the next production step.

The suction plate includes a base plate and a support plate with a large number of openings for receiving support posts and sensors. The base plate includes a connector to a vacuum pump. A space between base plate and support plate connects the vacuum pump with the selected openings in the support plate and at least a vacuum chambwe or a vacuum suction cup.

The vacuum chamber is defined by walls which are movable in accordance with the size of the circuit board to be handled in the printing operation. Attached to the sidewalls of the vacuum chamber or the support platw there are sensors which detect when a conveyor system supplies a new circuit board. The sensors control the conveyor system to advance the circuit board to the proper print position. A Z-axis drive lifts the suction plate until the circuit board rests in the side walls of the vacuum chamber or the support posts on the support plate. The vacuum is applied and the print operation can be performed. Additional positioning means can be used to move a circuit board to a desired position with high accuracy independent of the conveyor system.

The vacuum generated underneath the circuit board is of sufficient strength to overcome leakage of air into the chamber through openings in the circuit boards, such as vias, and minor openings in the movable side walls.

The support means are placed in suitable ones of a large number of openings in the support plate. These support means include plain support posts, posts with offset extensions, posts with suction cups. These different types of posts are required to maintain circuit boards in a plane position. The supports are positioned directly under the circuit board and do not interfere with any of the components on the lower side of the circuit board, where these components reach into the vacuum chamber. The posts with offset extensions are used to support the circuit board at locations which do not align with an opening in the support plate.

Support posts with suction cups are used to further inhibit bulging against the vacuum of the circuit board, and to further reduce horizontal movement of the printed circuit board during the print process. These suction cups are connected through the support posts to the vacuum generator.

Short cavity plugs are provided to seal unused openings in the suction plate, and especially all of the openings outside a vacuum chamber.

SHORT DESCRIPTION OF THE FIGURES

FIGS. 3A–3F are illustrations of various types of a support posts.

FIGS. 3G–3I are top views of support posts illustrated in FIGS. 3C–3E, respectively.

FIG. 3J is a top view of FIG. 3F.

DETAILED DESCRIPTION OF THE INVENTION

Figure 1:
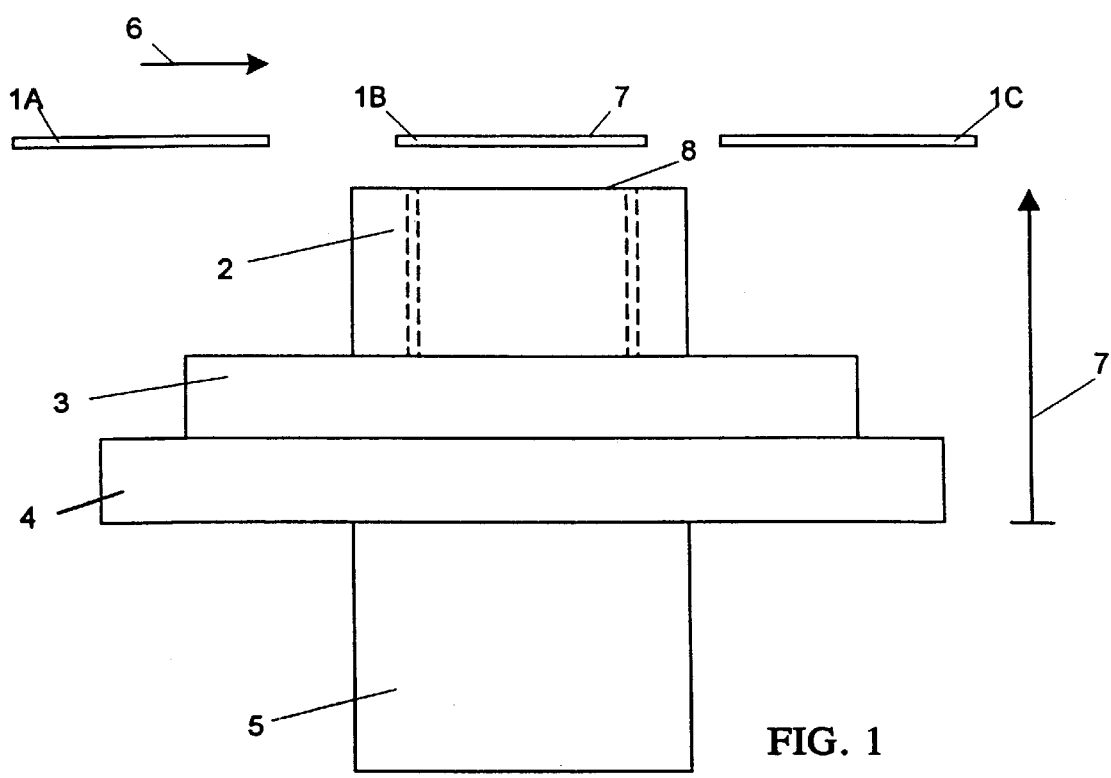
FIG. 1 is an illustration of the placement of the arrangement suction plate in a manufacturing place.

FIG. 1 is an illustration of the arrangement of a suction plate in a manufacturing place. FIG. 1 depicts an instance when three printed circuit boards 1A, 1B, and 1C, which are of the same type and size, pass the printing station on a conveyor belt in the direction as indicated by arrow 6. Board 1B is in the position for printing a pattern of solder paste on top side 7. Conveyor belt and printing mechanism are not shown in FIG. 1. Underneath the printing position there is a suction plate 3 of the present invention with a vacuum chamber 2, which is set up for the size of boards 1A–1C.

Suction plate 3 is supported by worktable 4. A Z-drive 5 is attached underneath worktable 4. Z-drive 5 lifts workbench 4, suction plate 3 with vacuum chamber 2 as indicated by arrow 7 to a height that board 2 rests on top rim 8 of vacuum chamber 2. Inside vacuum chamber 2 there are additional posts for supporting board 2 during the print process. Upon completion of the print process Z-drive 5 lowers the equipment to its original position and the boards 1A–1C are advanced by one process step position to the right.

Figure 2:
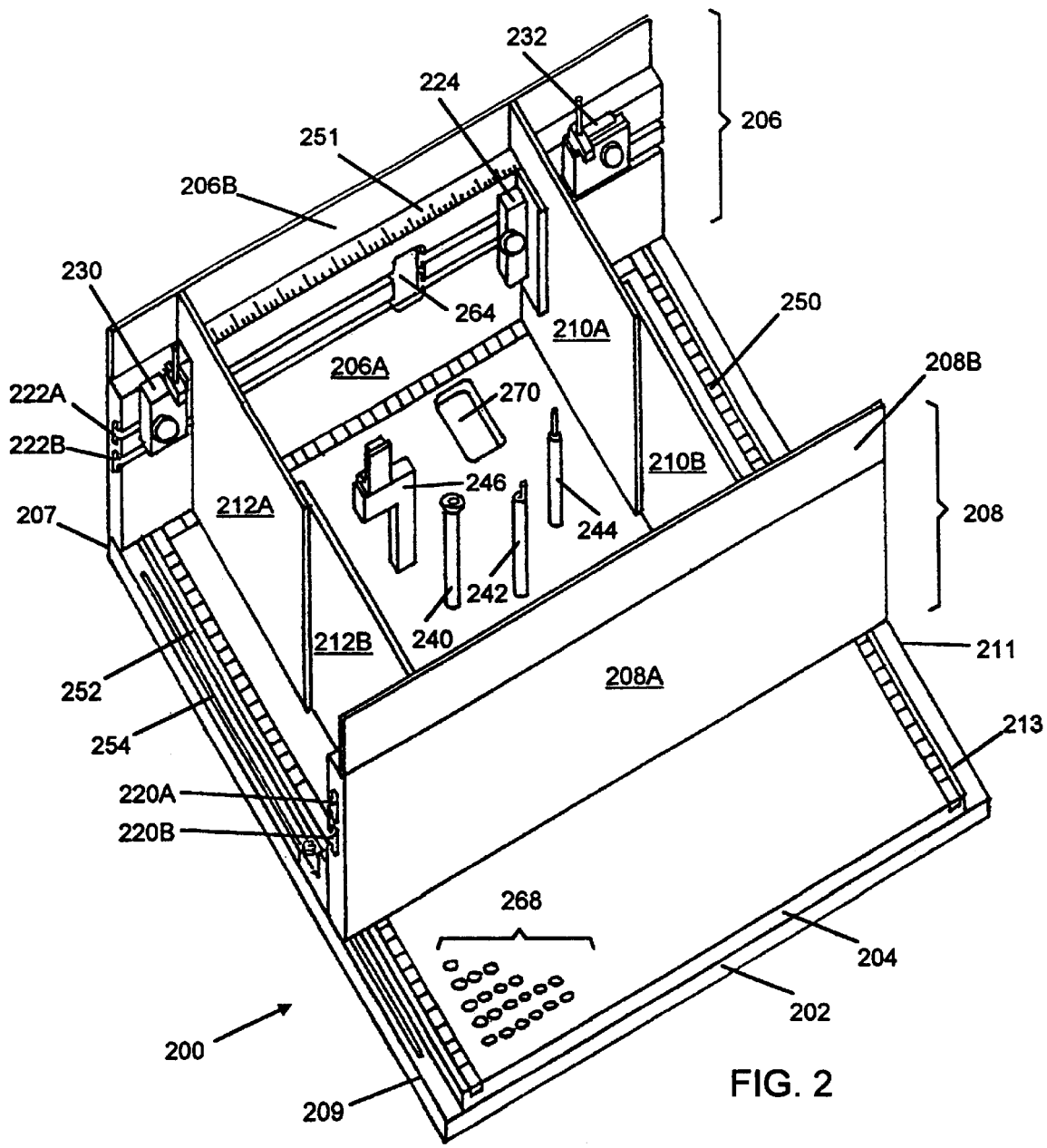
FIG. 2 is a perspective view of the suction plate.

FIG. 2 is a perspective view of the suction plate. Suction plate 200 has a base plate 202 and a support plate 204. Suction plate 200 has a large number of cavities, such as cavities 268 shown in the lower left corner of suction plate 200. These cavities are provided for mounting support posts, and are arranged in rows and columns. A side wall 206, consisting of lower section 206A and upper section 206B, is mounted near edge 207 of base plate 200. Near the two edges 209 and 211, which are normal to edge 207 there are rail 254 and guiding edge 213 for positioning of movable sidewall 208, consisting of lower section 208A and upper section 208B. Two sidewall components 210A and 212A are slidably mounted in rails 222A and 222B of sidewall 206. Two sidewall components 208B and 210B are slidably mounted in rails 220A and 220B of sidewall 208. Sidewall components 210A, 210B, 212A, 212B, and sidewalls 206 and 208 define a vacuum chamber, and their expose to edges provide support for a circuit board during the printing operation. Preferably, the sidewalls 206 and 208, and sidewall components 210A, 210B, 212A, 212B, support the printed circuit board at the edges of the board where there are no components mounted on the underside of the printed circuit board. Positioning of the sidewalls 206 and 208, and sidewall components 210A, 210B, 212A, 212B is done using a matrix of rows and columns, marked by scales 250, 252, marking rows, and scale 260 marking columns. Scales 250 and 252 carry markings 'A' through 'Z' and 'AA' through 'HH', scale 260 is marked '-21' through '0' to '21', whereby scale marking '0' is preferably referring to the center column of the cavities. However, other row and column designations are possible or may be more suitale in special applications. For each column positioned in each of the rows suction plate 3 has a cavity. A cavity van be occupied by a plug closing the cavity, or a post for supporting printed circuit board during printing operation. An additional opening 270 is provided near the center of sidewall 206 for connection to a vacuum suction pump, and to other means which are no part of the suction plate of the present invention. Opening 270 can be closed by a cover plate (not shown) to maintain the vacuum by plugs in openings 268 in support plate 204 exclusively. A recess 264 is provided for attaching tools and sensors to rails 222A and 222B inside vacuum chamber between sidewall components 210A and 212A.

Elements 240, 242, 244, and 246 as shown in FIG. 2 are illustrative of the forms of the support post as will be discussed in more detail below.

Figure 6A:
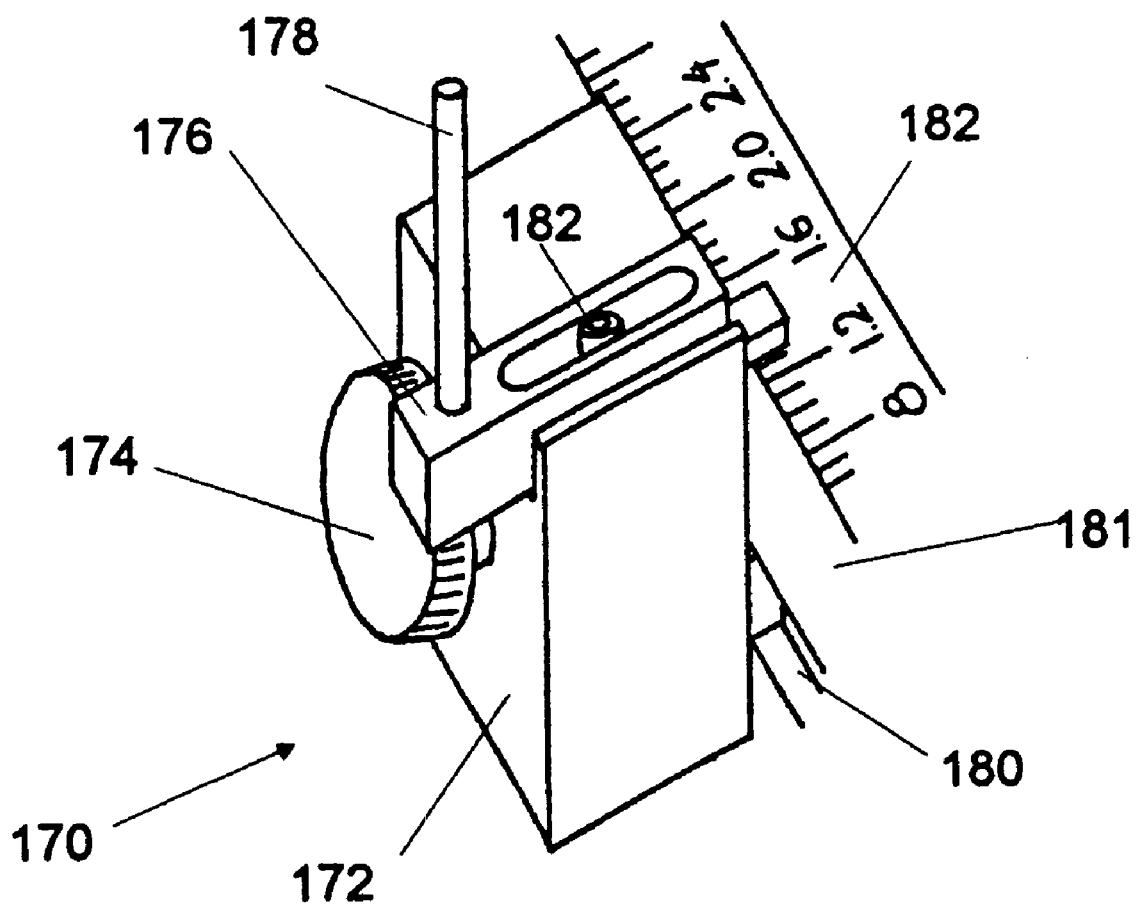
FIGS. 6A and 6B are illustrations of pneumatic board positioner.
Figure 6B:
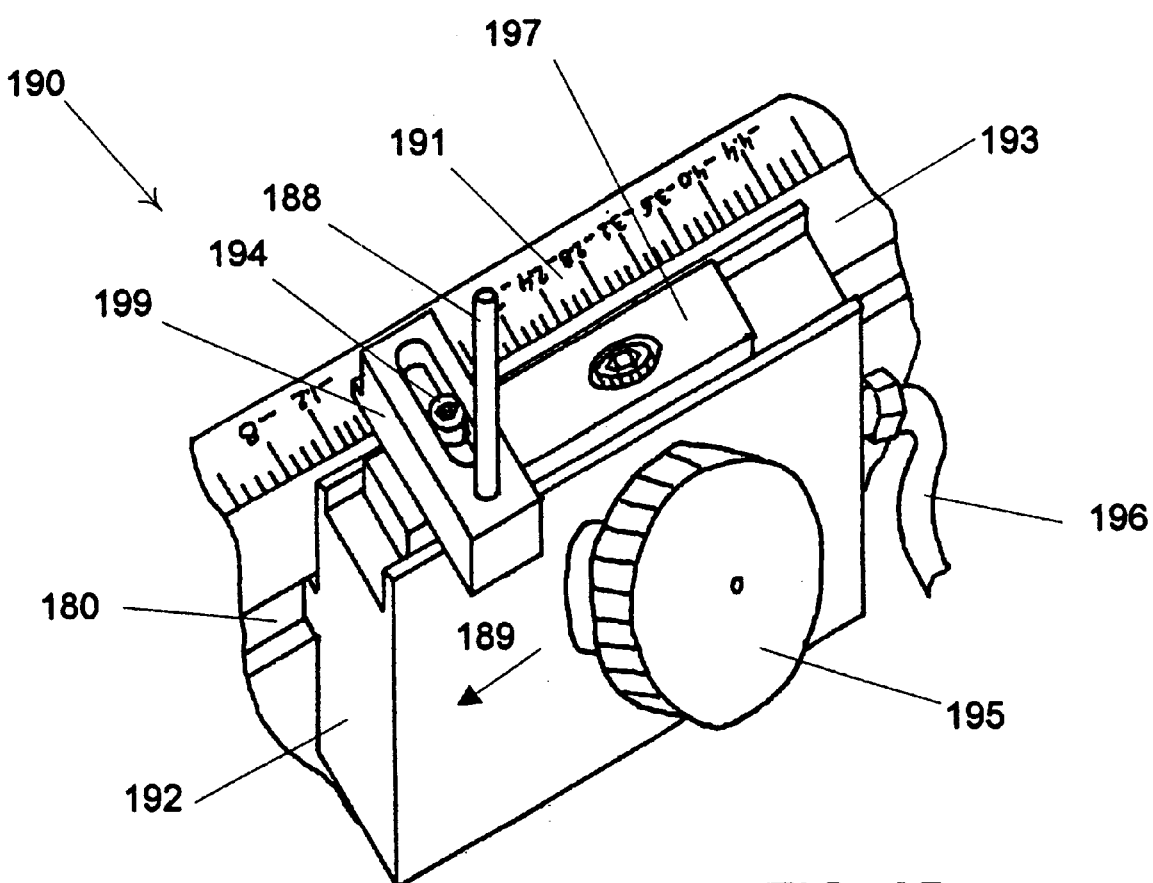

Sidewall 206 includes a second scale 251 for setting sidewall components 210A and 212A at a desired position and spacing. Scale 251 is also used to position a fixed stop 230 for the printed circuit board to be processed, and to position a variable stop 232 used for pushing a printed circuit board towards a fixed stop 230. FIG. 6A is a more detailed illustration of fixed stop 230. FIG. 6B is a more detailed illustration of variable stop 232.

During a processing the printed circuit board is moved by a conveyor system in parallel with sidewalls 206 and 208 across the vacuum chamber towards fixed stop 230. After suction plate 200 is sufficiently lifted so that the printed circuit board can rest on the upper edges of sidewalls 206 and 208, and sidewall components 210A, 210B, 212A, 212B, variable stop 232 is activated and pushes the printed circuit board against fixed stop 230. At that time the printed circuit board is properly positioned and the printing process can begin.

FIGS. 3A–3F are illustrations of various types of a support posts. As illustrated in FIG. 3A a support post 48 has a foot 50 and a stem 52. Face 54 at the upper end of stem 52 is the interface for supporting a printed circuit board during a printing operation. At the lower end stem 52 has a cross-section 56 which is slightly larger than the cross-section 58 of cavity 60 into which foot 50 of support post 48 has been placed. Support post 48 rests with ring surface on surface 57 of suction plate 62. Thus the length of stem 52 determines the height of face 54 above the top surface of suction plate 62. Foot 50 does not reach bottom 64 of cavity 60. Co-axial position of foot 50 and cavity 60 is established by two elastic rings 66 and 68. Elastic ring 66 aligns foot 50 with cavity 60 in base plate 72. Elastic ring 68 aligns foot 50 with hole 74 in support plate 76 of suction plate 62. A vacuum chamber is provided between base plate 72 and support plate 76.

FIG. 3B is an illustration of a support post 78 with a vertical air suction channel 80 which is connected to a short horizontal channel 82, which in turn connects with the vacuum chamber 70 of suction plate 62 (see FIG. 3A). Support post 78 rests with ring surface 79 on the suction plate. The upper end 82 will hold in place the printed circuit board by the applied vacuum as soon as the surface of the printed circuit board rests on face 84 of support post 78.

FIG. 3C is an illustration of a support post 90 with a suction cup 92 for folding a printed circuit board. A vertical air suction channel 91 which is connected to a short horizontal channel 93, which connects with the vacuum chamber 70 of suction plate 62 (see FIG. 3A). Top end 94 of post 90 is suitably formed for receiving suction cup 92. Face 96 of top end 94 is at the same height above suction plate 76 as face 54 of post 48. To maintain a vacuum inside suction cup 92 while a circuit board rests on face 96 there is a groove 98 extending radially from suction channel 91. In non-loaded condition upper rim 98 of suction cup 94 is slightly higher than face 96. The difference in height of rim 99 and face 96 depends on the elasticity of suction cup 92 and the surface characteristic of the printed circuit board, i.e. what differences in planarity of the printed circuit board have to be dealt with.

FIG. 3D is an illustration of a support post 100 with thinner central extension 102 of stem 104. A support post of the type shown in FIG. 3D is used if the space between components on the circuit board is too small for using a post as shown in FIGS. 3A, 3B or 3C, and if the used support space on the circuit board is just above the center of a cavity in the suction plate.

FIG. 3E is an illustration of a support post 106 with an extension 108 off center to stem 110. Post 106 can be turned in the cavity it is placed to have extension 108 support the printed circuit board at a place not just above the center of the particular cavity.

FIG. 3G–3I are top view illustrations of support posts illustrated in FIGS. 3C–3E, respectively. In FIG. 3G groove 98 is shown to cross face 96 of top end 94. FIG. 3H is the top view illustration of support post 100 with a round central extension 102 of stem 104. FIG. 3I is the top view illustration of support post 106 with an offset extension 108 of stem 110. Extension 108 is shown to have a square cross-section. However, the cross-section may have other forms, depending on the manufacturing methods or the demands of the free space of the printed circuit board it is to support. The free space of the printed circuit board available for supporting with a support post during a printing process may also determine the offset of the extension from the center of the support post.

FIG. 3J is an illustration of a support post 106 with three feet 124, 128, and 130 to be placed into three adjacent cavities of the same row or column of a suction plate of the present invention. A support post as shown in FIG. 3J can be used to hold special measuring tools or support means. Stem 120 can be of a type discussed above with reference to FIGS. 3a through 3G. A Block 126 is attached to post 120 to hold two of the three feet 124, 128 and 130. This block can be used to hold additional tools. Stem 120 may have a suction hole 122.

Figure 4:
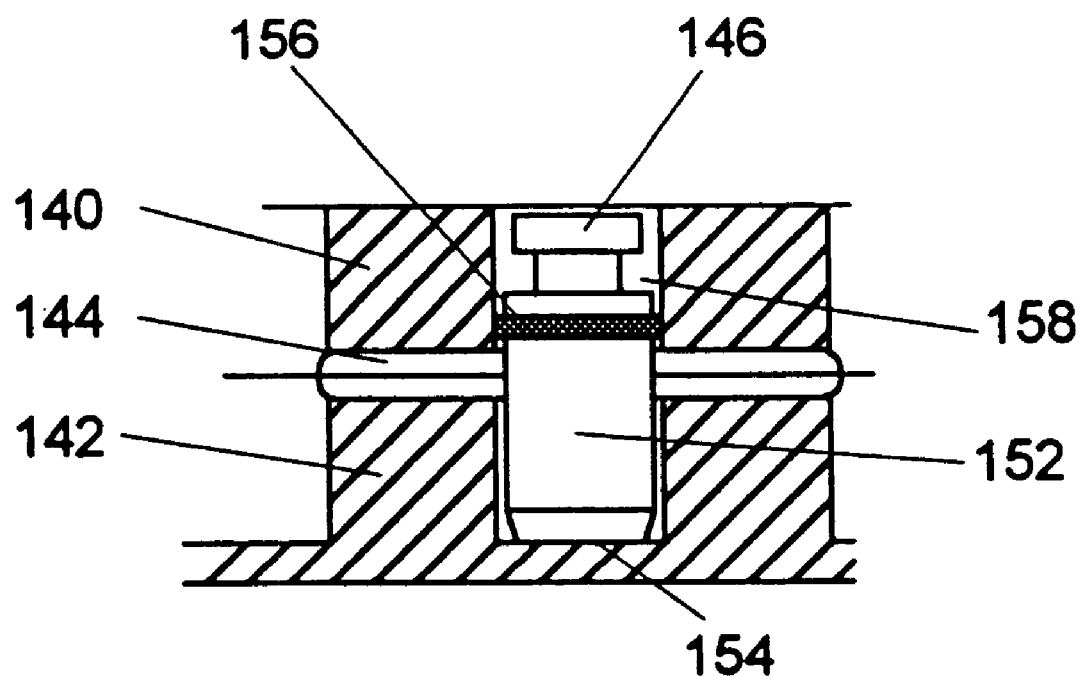
FIG. 4 is an illustration of a cavity plug.

FIG. 4 is an illustration of a cavity plug in a cavity of the suction plate. The suction plate includes base plate 142 and support plate 140. A space 144 provides the connection between cavities in the suction plate and the vacuum pumps, in FIG. 4 cavity plug 152 is inserted in cavity 158. The lower end 154 of cavity plug 152 contacts the bottom of cavity 158. This ensures that the upper end of cavity plug 152 does not protrude the top surface of support plate 140. An elastic ring 156 closes cavity 158. Al cavities of the suction plate outside the vacuum chamber have to be closed off with such cavity plugs.

Figure 5A:
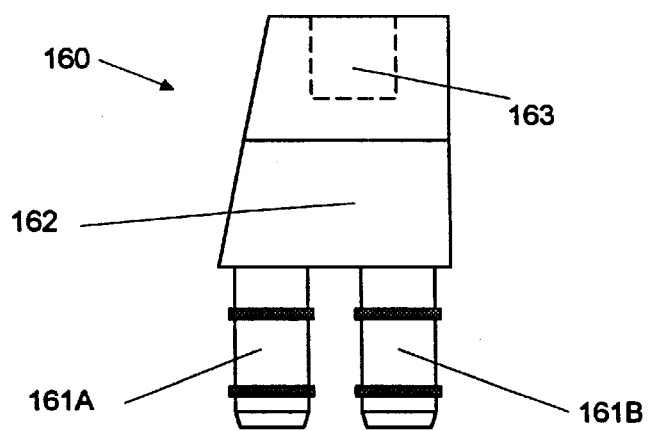
FIGS. 5A and 5B are side view illustrations of a dual foot post.
Figure 5B:
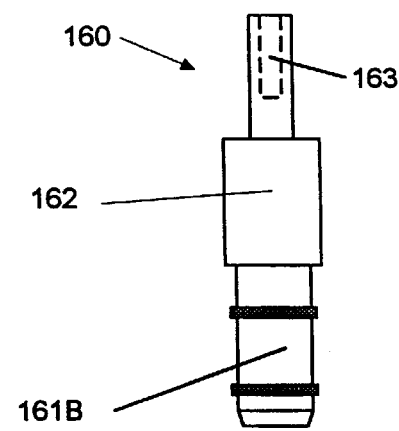

FIGS. 5A and 5B are side view illustrations of a dual cavity plug 160, as an example for a row or column oriented post. It includes two feet 161A and 161B to mount is in a preferred direction in the suction plate, and a recess 163 into which optical or mechanical sensing means can be mounted e.g. for generating an edge signal when the edge of the next printed wiring board to be handled in a printing process is passing. An edge signal can be used to stop the conveyor means which supply the printed wiring board A proximity signal can be used to lift the suction plate towards the printed wiring board until the printed wiring board is within operating proximity of the printed wiring board positioning means. The shape of the body 162 can be modified to need and requirement. The top end can be used for supporting the printed circuit board if the board has a surface sufficiently large enough to match the top surface of boy 162.

FIGS. 6A and 6B are illustrations of pneumatic board positioning means, which include an adjustable printed circuit stop 170 and a adjustable controlled pneumatic print wiring board pusher 190. When the suction plate is lifted in operating proximity of the printed wiring board positioning means the Printed wiring board is located between printed circuit stop 170 and print wiring board pusher 190. Print wiring board pusher 190 receives a signal from a operational cycle controller and pushes the printed wiring board towards printed circuit stop 170, which places the printed wiring board in a position in which it can rest on the walls of the vacuum chamber.

Adjustable printed circuit stop 170 is attached to rail 180, one of the rails 222A and 222B in FIG. 2 at one side of the vacuum chamber. It is adjusted to a desired position using scale 182 (scale 251 in FIG. 2) and held in that position by a clamping means under control of knob 174. Main body 172 carries board stop 178, which is settable at a desired distance from sidewall 171 by screw 182.

Mounting block 192 of print wiring board pusher 190 (see FIG. 6B) is attached to rail 180 using set screw 195 at the other side of the vacuum chamber. Rail 180 is one of the rails 222A and 222B in FIG. 2. Upon receiving a positioning signal via pneumatic control line 196 slider 197 and push rod 188 are moved to the left, towards the printed wiring board and pushes the board towards board stop 178, as indicated by arrow 189. Print wiring board pusher 190 is adjusted to adesired position using scale 191 (scale 251 in FIG. 2) and held in that position by a clamping means under control of set screw 195. Push rod 188 is attached to slider 197 by an adjustment block 199 so that pushrod 188 can be set to a desired distance from sidewall 193 by screw 194. It is within the scope of the invention to replace the pneumatic control of slider 197 by other means of activation, such as electrical, or mechanical.

The above description discloses the use of the suction plate with fixed and movable walls, which establish a vacuum chamber. However, as already indicated, support posts with suction cups can be used when there is either no continuous space avaible at the lower side of the printed circuit board to establish a vacuum chamber or when one or more support posts with suction cups hold the printed circuit board in position while other support posts support the printed circuit board as needed during the print operation. In the latter case, fixed and movable walls may be used for providing lokal support for the printed circuit board without establishing a vacuum chamber.

What I claim is:

1. An apparatus for holding in position a printed circuit board during a printing process, comprising:
    a suction plate having a plurality of cavities arranged in a plurality of rows and a plurality of columns,
    an encasing arrangement including movable sidewalls and expandable, movable sidewalls attached to said suction plate and establishing a vacuum chamber for holding said printed circuit board at a height above said suction plate,
    at least one support post mounted in at least one of said cavities of said suction plate for supporting said printed circuit board inside said vacuum chamber,
    a plurality of cavity plugs for closing unused ones of said plurality of cavities in said suction plate and, wherein said cavities have a first cross-section, and
    wherein each support post includes
    a stem having a second cross-section, larger than said first cross-section, and
    a foot having a third cross-section,
    said third cross-section being smaller than said second cross-section and said first cross-section.

2. An apparatus for holding in position a printed circuit board during a printing process, as claimed in claim 1, wherein
    said suction plate includes a base plate having a recess for each of said cavities, and a cover plate having an opening for each of said cavities.

3. An apparatus for holding in position a printed circuit board during a printing process, as claimed in claim 1, wherein
    said suction plate includes a secondary vacuum chamber interconnecting a plurality of said cavities.

4. An apparatus for holding in position a printed circuit board during a printing process, as claimed in claim 3, wherein
    each of said support posts includes:
        a first elastic ring and a second elastic ring;
            said first elastic ring centering each support post in one of openings in a cover plate, and said second elastic ring centering each support post in a recess of a base plate corresponding to said one of said openings in said cover plate.

5. An apparatus for holding in position a printed circuit board during a printing process, as claimed in claim 3, wherein
at least one of said at least one support posts has a free end opposite to said foot, and includes at least one pneumatic suction cup at said free end for attaching said support post to said printed circuit board, said at least one support post further including a pneumatic channel between said at least one pneumatic cup and a location in said foot suitable for conveying air with said secondary vacuum chamber.

6. An apparatus for holding in position a printed circuit board during printing process, comprising:
a suction plate having a plurality of cavities,
plurality of support means mounted in said cavities of said suction plate for supporting said printed circuit board,
a plurality of cavity plugs for closing unused ones of said plurality of cavities in said suction plate and wherein said cavities have a first cross-section, and
wherein each of said plurality of support means includes
a stem having a second cross-section, larger than said first cross-section, and
a foot having a third cross-section,
said third cross section being smaller than said second cross-section and said first cross-section.

7. An apparatus for holding in position a printed circuit board during a printing process as claimed in claim 6, further including at least one side wall, and wherein said plurality of support means includes at least one support post having a suction cup.

8. An apparatus for holding in position a printed circuit board during a printing process, as claimed in claim 6, wherein
said suction plate includes a base plate having a recess for each of said cavities, and a cover plate having an opening for each of said cavities.

9. An apparatus for holding in position a printed circuit board during a printing process, as claimed in claim 6, wherein
said suction plate includes a vacuum chamber interconnecting said cavities.

10. An apparatus for holding in position a printed circuit board during a printing process, as claimed in claim 8, wherein
said support means includes:
a first elastic ring and a second elastic ring;
said first elastic ring centering a support post in one of openings in said cover plate, and
said second elastic ring centering said support post in a recess of said base plate corresponding to said one of said openings in said cover plate.

11. An apparatus for holding in position a printed circuit board during a printing process, as claimed in claim 6, wherein
at least one of said plurality of support means has a free end opposite to said foot, and includes at least one pneumatic suction cup at said free end for attaching a support post to said printed circuit board, said support post further including a pneumatic channel between said at least one pneumatic cup and a location in said foot.

* * * * *